(12) United States Patent
Weiden et al.

(10) Patent No.: US 10,340,640 B2
(45) Date of Patent: Jul. 2, 2019

(54) SYSTEM AND METHOD FOR DETERMINING THE CURRENT CONDITION OF POWER CONTACTS

(71) Applicant: SCHNEIDER ELECTRIC USA, INC., Andover, MA (US)

(72) Inventors: Conrad S. Weiden, Chapel Hill, NC (US); Hien M. Nguyen, Chapel Hill, NC (US); Michael V. Maloney, Raleigh, NC (US); Samuel Jacob Calloway, Lake Oswego, OR (US); Anthony Reac Martinez Arazo, Knightdale, NC (US)

(73) Assignee: SCHNEIDER ELECTRIC USA, INC., Andover, MA (US)

( * ) Notice: Subject to any disclaimer, the term of this patent is extended or adjusted under 35 U.S.C. 154(b) by 59 days.

(21) Appl. No.: 15/586,586

(22) Filed: May 4, 2017

(65) Prior Publication Data
US 2018/0323551 A1 Nov. 8, 2018

(51) Int. Cl.
*H01R 13/66* (2006.01)
*H01R 43/00* (2006.01)
*G01R 19/165* (2006.01)
*H01R 13/703* (2006.01)

(52) U.S. Cl.
CPC ....... *H01R 13/6683* (2013.01); *G01R 19/165* (2013.01); *H01R 13/7037* (2013.01); *H01R 43/002* (2013.01)

(58) Field of Classification Search
CPC .. G01R 19/165; H01R 13/08; H01R 13/6683; H01R 13/7037; H01R 43/002; H01H 9/38
See application file for complete search history.

(56) References Cited

U.S. PATENT DOCUMENTS

| 4,420,784 A * | 12/1983 | Chen ................. H01H 9/30 |
|  |  | 361/13 |
| 4,780,786 A | 10/1988 | Weynachter et al. |
| 6,225,807 B1 | 5/2001 | Pohl |
| 6,231,227 B1 | 5/2001 | Andersen |
| 6,313,636 B1 | 11/2001 | Pohl et al. |
| 6,359,440 B2 | 3/2002 | Pohl et al. |
| 7,109,720 B2 | 9/2006 | Baurand et al. |
| 7,705,601 B2 | 4/2010 | Zhou et al. |
| 2001/0019573 A1 | 9/2001 | Dougherty et al. |

(Continued)

FOREIGN PATENT DOCUMENTS

EP 0694937 A2 1/1996

*Primary Examiner* — Bryan Bui
(74) *Attorney, Agent, or Firm* — Lando & Anastasi, LLP (57) ABSTRACT

A method and apparatus for determining the current condition of power contacts and providing an indication to a preventive maintenance system and/or a user of required power contact replacement. The method includes auxiliary contacts providing a low power binary signal to a processor in response to movements of a contact carrier supporting the movable auxiliary contacts and movable power contacts. The low power binary signals, in combination with physical features of the contact carrier and a signal indicating the state of the power contact, provide information to the processor for determining the current condition of the power contacts, and if the current condition exceeds a predetermined limit, notifying the preventive maintenance system and/or the user.

19 Claims, 10 Drawing Sheets

(56) References Cited

U.S. PATENT DOCUMENTS

2005/0219020 A1\* 10/2005 Wabner ................ H01H 1/2016
335/132
2010/0127805 A1\* 5/2010 Bollinger ............. H01H 50/045
335/131

\* cited by examiner

PRIOR ART

SYSTEM AND METHOD FOR DETERMINING THE CURRENT CONDITION OF POWER CONTACTS

FIELD OF THE INVENTION

The invention is generally directed to electric power contacts and particularly to preventive maintenance of equipment employing power contacts.

BACKGROUND OF THE INVENTION

Figure 1:
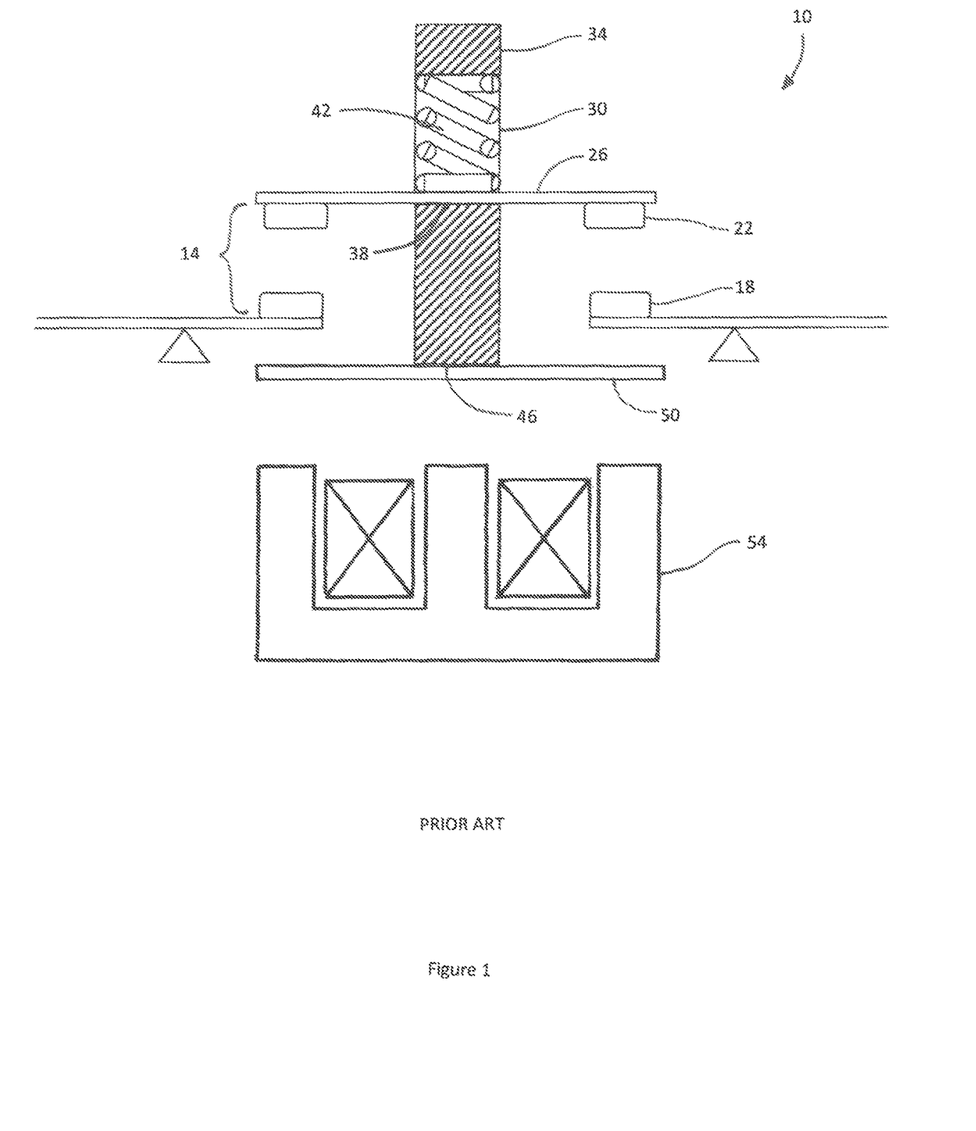
FIG. 1 illustrates a typical contactor having fixed and movable power contact.

The use of electrical contactors or other power control means that operate in a similar manner, as generally represented by reference numeral 10 in FIG. 1, for powering electrical equipment is well known. The contactor 10 includes a power contact 14, having one or more sets of two fixed power contacts 18, one being the input contact connected to a power source and the other being the output or load contact connected to equipment that will receive power from the power source. The contactor 10 also includes a set of two movable power contacts 22, electrically connected by a bridge 26, for each set of fixed power contacts 18. The fixed power contacts 18 are generally secured to a structural component of the contactor 10 such that they do not move. The bridge 26 of movable power contacts 22 is mounted in a window 30 defined in a contact carrier 34. The bridge 26 is biased against a generally flat support surface 38 of the window 30 by means such as a spring 42. The support surface 38 is generally perpendicular to the longitudinal axis of the contact carrier 34. The contact carrier 34 is normally biased by means, such as a spring (not shown), to a positon in which the movable power contacts 22 are not in electrical contact with the fixed power contacts 18. In this position the bridge 26 of the movable power contacts 22 is biased against the support surface 38 of window 30 by bridge biasing spring 42. An operating end 46 of the contact carrier 34 is attached to an armature 50 of an electromagnet 54. When power is applied to the electromagnet 54 the armature 50 is drawn into contact with the electromagnet 54. This movement of the armature 50 pulls the attached contact carrier 34 toward the electromagnet 54 causing the movable power contacts 22 to engage the fixed power contacts 18, thereby connecting the power source to any equipment connected to the output of the contactor 10. The movable power contacts 22 engage the fixed power contacts 18 before the armature 50 has fully engaged the electromagnet 54. The bridge biasing spring 42 permits a displacement of the bridge 26 away from the support surface 38 in the window 30 as the armature 50 continues moving toward the electromagnet 54. Therefore, the magnetic attraction between the armature 50 and electromagnet 54 must be stronger than the contact carrier biasing means and the bridge biasing spring 42 to overcome their combined force and close the power contacts 18 and 22, and then to maintain a positive closed position between power contacts 18 and 22. The displacement of the bridge 26 compresses the biasing spring 42 against the bridge 26 and ensures that a positive connection is maintained between the movable power contacts 22 and fixed power contacts 18. This displacement of the bridge 26 within the window 30 and the increased pressure of the bridge biasing spring 42 against the bridge 26 cannot prevent wear of the power contacts 18 and 22, but it can compensate for some of the eventual contact wear.

When power to the electromagnet 54 is terminated the contact carrier biasing means moves the contact carrier 34 away from the electromagnet 54, thereby separating the movable power contacts 22 from the fixed power contacts 18. Since the contact carrier biasing means does not exert as much force as the magnetic attraction of the electromagnet 54 the movable power contacts 22 will not separate from the fixed power contacts 22 as fast as they close on them. Therefore, the power contact 18 and 22 will open a little slower and be subjected to more arcing than during closing. Arcing is a major contributor to wear of the power contacts 18 and 22. As the power contacts 18 and 22 wear, the gap between them increases and their surfaces become more irregular forming more arcing points, which speed up contact wear. Therefore, periodic preventive maintenance should include inspection of the power contacts 18 and 22. If preventive maintenance is not done and the power contacts 18 and 22 fail, unscheduled down time will be required to replace the power contacts 18 and 22 and repair any damage to equipment connected to the contactor 10 and/or products being manufactured by the equipment. Contactor manufacturers generally provide some method or guidelines for inspecting the condition of their power contacts 18 and 22 to determine if they are worn to a point where they require replacement. Normally this contact inspection requires that the contactor 10 be taken off line and partially disassembled to permit a visual inspection of the power contacts 18 and 22. This requires down time of the equipment in which the contactor 10 is installed, any machinery that receives power form the contactor 10, any equipment that might require operation of the equipment connected the contactor 10 that is being inspected and time for a maintenance person to perform the inspection. Since so much down time is consumed doing the periodic inspection the power contacts 14 are usually replaced regardless of their wear condition, which adds to the down time cost. Therefore, it would be desirable to have a continuously running contact evaluation system that learns the initial configuration of the power contacts 18 and 22, can provide current condition information about the power contacts 18 and 22, continuously or in response to a request, and provide a notification of required maintenance when power contacts 18 and 22 have reached a predetermined level of wear (wear limit) without the need of shutting equipment down for a periodic human inspection of power contacts 18 and 22.

SUMMARY OF THE INVENTION

Aspects of the present invention provide a system and method for continuously determining the current condition of the power contacts and indicating to a preventive maintenance system or human via a human machine interface (HMI) when preventive maintenance should be done. In at least one aspect, a system includes mechanical features of the contactor mechanism that permit a processor, using an algorithm of the system, to continuously monitor and determine the current condition of the power contacts. The system determines the current condition of the power contacts based on data collected from ongoing operation of the contactor or other equipment in which power contacts are installed without requiring disassembly of the contactor for visual inspection of the power contacts. The system for determining a current condition of a power contact in an electrical contactor may include:

a power contact having a movable contact supported on a bridge and a fixed contact;

a first auxiliary contact having a movable contact supported on a bridge and a fixed contact;

a second auxiliary contact having a movable contact supported on a bridge and a fixed contact;

a contact carrier supporting the movable power contact bridge, the first auxiliary movable contact bridge and the second auxiliary movable contact bridge such that the movable contacts move in unison and such that the movable contacts of the first and second auxiliary contacts are spaced apart by a first fixed distance and the movable contacts of the second auxiliary contacts and the movable power contacts are spaced apart by a second fixed distance;

a controller having a processor and a non-tangible memory, the processor receiving a binary signal from each of the power contact, the first auxiliary contact and the second auxiliary contact indicating the opening or closing of their respective movable contacts and storing each binary signal received from the power contact, the first auxiliary contact and the second auxiliary contact in the non-tangible memory; and, an algorithm stored in the memory, the algorithm being executed by the processor to determine the current condition of the power contact based on the stored binary signals, the fixed distances and previously stored contactor characteristics, the processor notifying a preventive maintenance system and/or a user that preventive maintenance on the contactor is required when the determined current condition of the power contact has exceeded a predetermined wear limit.

Another aspect is directed to a method for determining a current condition of a power contact in an electrical contactor including:

determining, by a processor, a closing/opening speed of a contact carrier of the electrical contactor;

determining, by the processor, an expected closing/opening time for a movable power contact supported on the contact carrier; sensing, by the processor, an actual closing/opening time of the movable power contact;

determining, by the processor, the current condition of the power contact using the determined contact carrier speed, the determined expected closing/opening time of the movable power contact, the sensed actual closing/opening time of the movable power contact and one or more characteristic of the contactor; and notifying, by the processor, a preventive maintenance system and/or a user that preventive maintenance is required when the determined current condition of the power contact has exceeded a predetermined wear limit.

BRIEF DESCRIPTION OF THE DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION OF THE EMBODIMENTS

Figure 2:
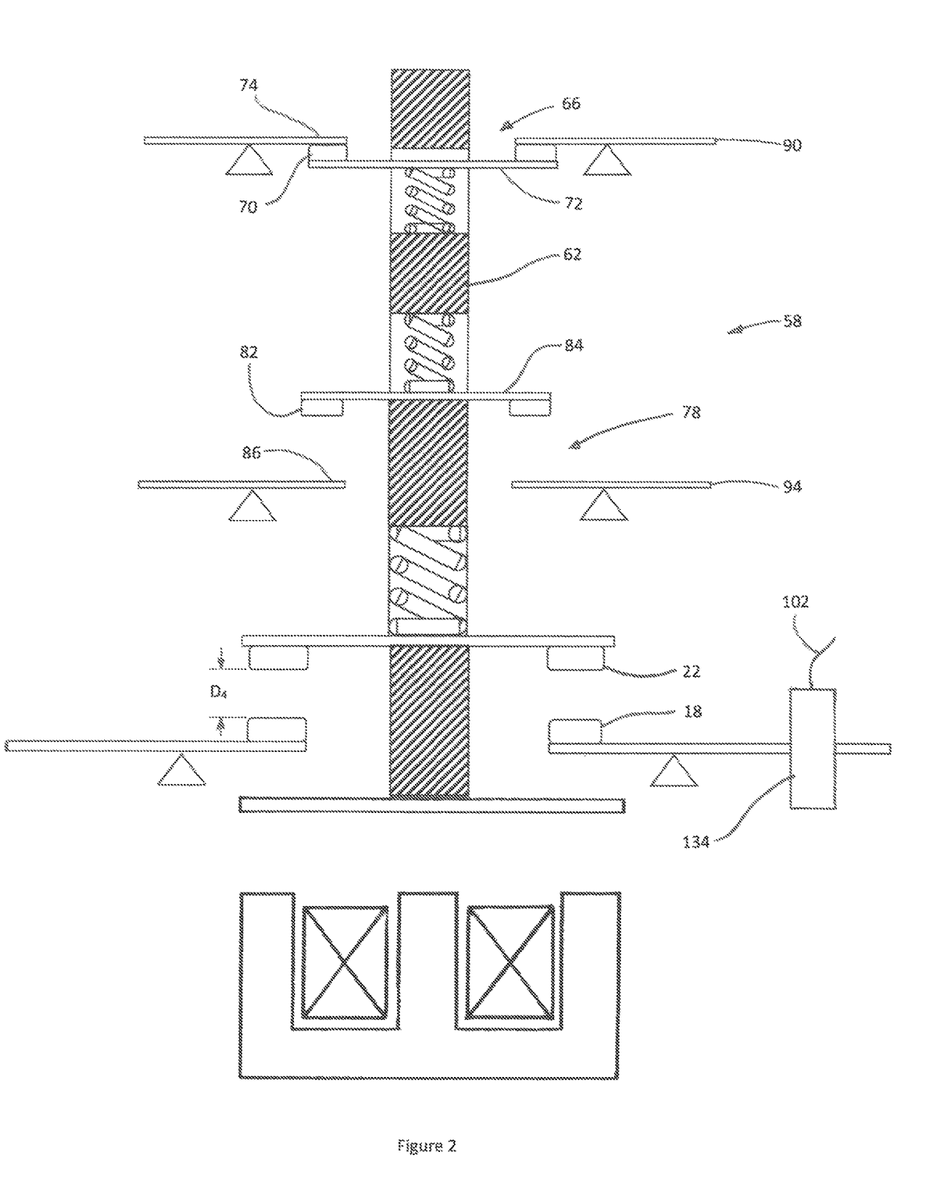
FIG. 2 illustrates a contactor of the present invention and the position of the movable auxiliary contacts at the stable open (OFF) state of the movable power contact.
Figure 8:
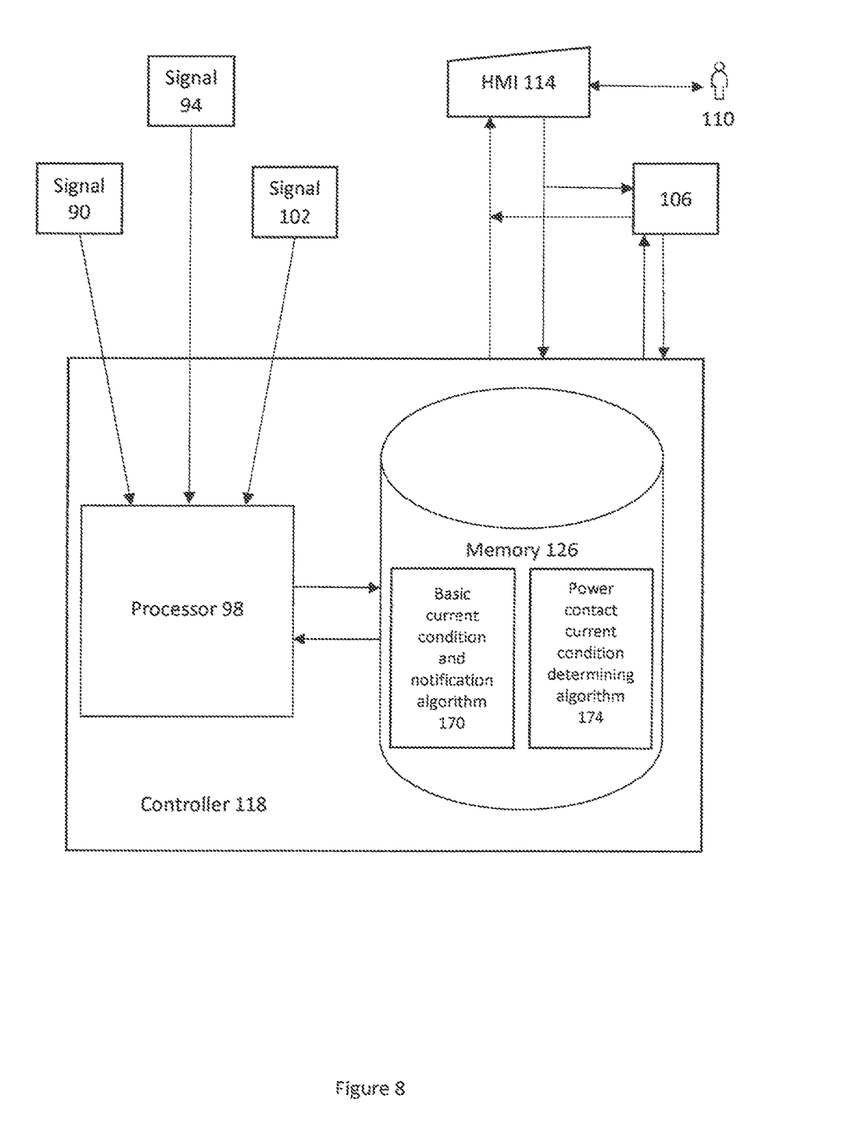
FIG. 8 illustrates processing components of the controller.

Referring now to FIG. 2, a contactor, generally represented by reference numeral 58, having the mechanical features for continuously monitoring the current condition of a power contact is illustrated in a stable OFF (OPEN) state where the fixed and movable power contacts, 18 and 22 respectively, are fully separated. The contactor 58 includes all of the elements of the state of the art contactor 10 as illustrated in FIG. 1 and new elements including a new contact carrier 62, a normally closed (NC) auxiliary contact 66 having movable contacts 70, supported on a bridge 72 and fixed contacts 74, and a normally open (NO) auxiliary contact 78 having movable contacts 82, supported on a bridge 84 and fixed contacts 86. The contact carrier 62 has been configured to support the movable NC auxiliary contacts 70 and the movable NO auxiliary contact 82, such that the movable NC auxiliary contacts 70 and the movable NO auxiliary contacts 82 move in unison with the movable power contacts 22. It is to be understood that the positions of the NC and NO auxiliary contacts, 66 and 78 respectively, and the power contact 14 can be arranged differently from those shown in the FIGS. 3-6 and that both auxiliary contacts 66 and 78 could be either NO or NC without affecting the operation of the invention. The NC and NO auxiliary contacts, 66 and 78 respectively, provide only low power binary signals, 90 and 94 respectively, to a processor 98 (FIG. 8). Therefore, NC and NO auxiliary contacts, 66 and 78 respectively, are subjected to very little, if any, contact wear over the life of the contactor 58. The processor 98, with an additional signal 102 representing a change of state of the power contact 14 and sent from a current transformer (CT) 134 monitoring the load side of power contact 14, learns characteristics of the contactor 58 that are used by the processor 98 to determine the current condition of the fixed and movable contacts, 18 and 22 respectively, of the power contact 14. Using the determined/learned characteristics, the processor 98 can also estimate the remaining life of the power contact 14, and can alert an automated preventive maintenance system 106 and/or user 110 via an HMI 114 (FIG. 8) when the power contact 14 has reached a predetermined level of wear (wear limit). The predetermined wear limit should be determined by the user 110 such that a notification/warning of required contactor 58 maintenance can be provided to the automated preventive maintenance system 106 and/or user 110 sufficiently ahead of a potential power contact 14 failure that an acceptable maintenance down time of the contactor 10 and any affected equipment can be scheduled. The processor 98, and its associated components as shown in FIG. 8, can be located in contactor 58 or in a controller 118, such as a programmable logic controller (PLC) or other "smart" device located at a remote location.

As used in the following description of the present invention, determined/learned characteristics can include the initial and/or current opening and closing speed of the contact carrier 62, the initial and/or current time between opening of the NC and closing of the NO auxiliary contacts, 66 and 78 respectively, or opening of the NO and closing of the NC auxiliary contacts, 78 and 66 respectively, the initial or current time between opening or closing of the NO auxiliary contact 78 and opening or closing of the power contact 14, and the initial and/or currently expected opening or closing time of the power contact 14. The initial values for these characteristics and an estimated number of contactor lifetime operations ECLO can be learned during a predetermined number of initial operations of the contactor 58 or provided by the manufacturer based on product development testing or a Design of Experiments (DOE) process. The current condition values for these characteristics reflect the most recent "ON" or "OFF" state change of contactor 58 and can be determined by the processor 98 using the system algorithms 170 and 174 during normal operation of the contactor 58. Measured or provided characteristics can include the fixed distances between movable contact bridge supports 38, 122 and 130, the initial thickness of the fixed and movable power contacts, 18 and 22 respectively, and/or the initial distance (gap) between the fixed and movable power contacts, 18 and 22 respectively. The algorithms 170 and 174 of the system can continuously process the sensed signals 90 and 94 from the NC and NO auxiliary contacts, 66 and 78 respectively, and signal 102 from the power contact 14 with respect to the fixed distances between movable contact bridge supports 38, 122 and 130 to determine the current condition of the power contacts, 18 and 22 respectively, and provide a warning when the current condition of the power contacts, 18 and 22 respectively, exceeds the predetermined wear limit.

Figure 4:
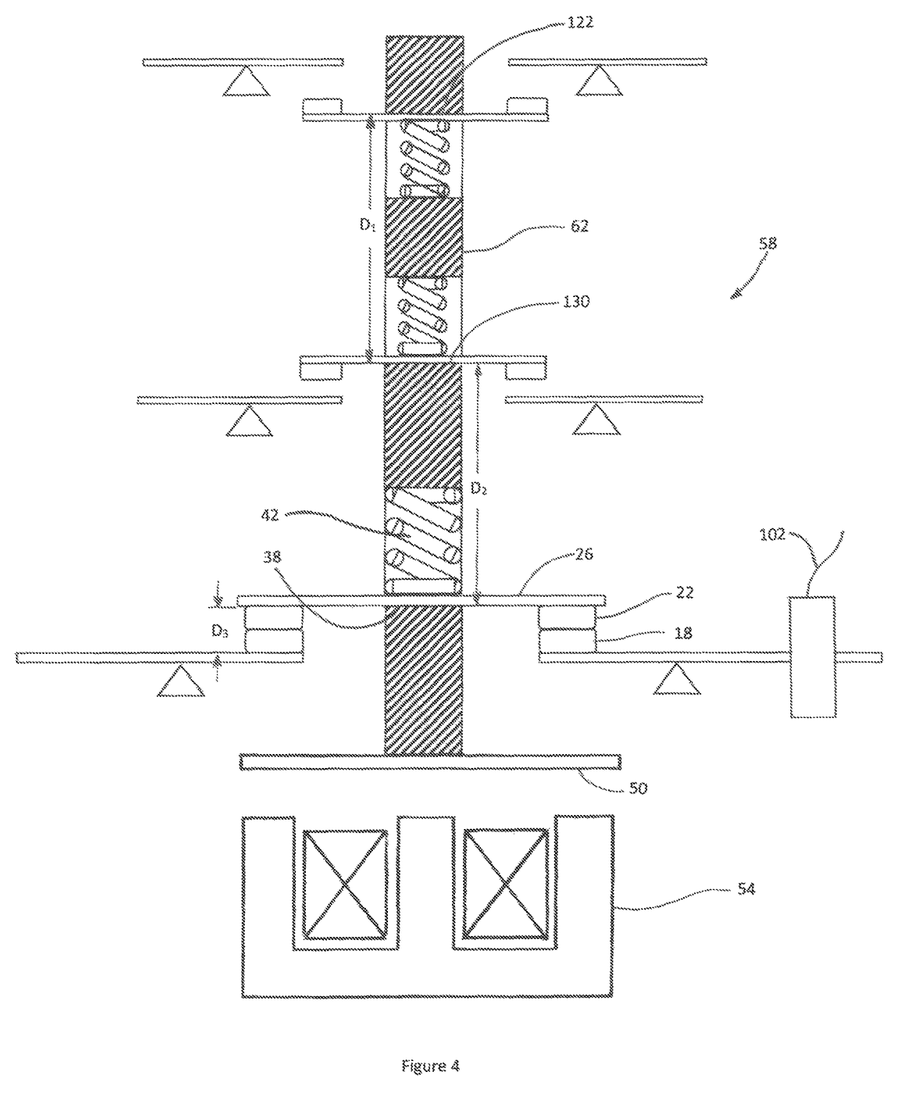
FIG. 4 illustrates the position of the movable NO auxiliary contact as the movable power contact makes contact with the fixed power contact.
Figure 5:
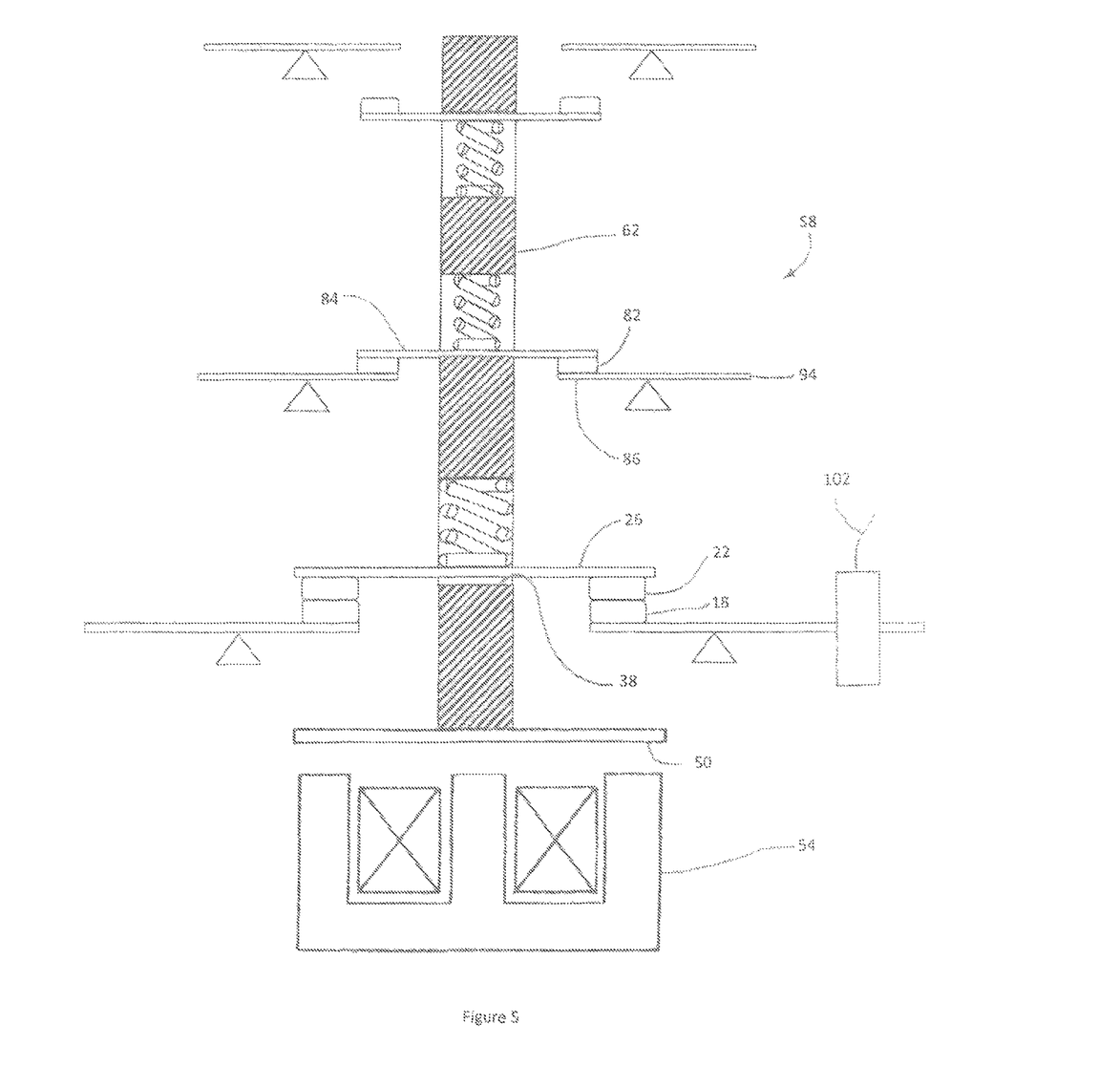
FIG. 5 illustrates the positions of the movable NC auxiliary contact and the movable power contact as the NO auxiliary contact makes contact with the fixed NO auxiliary contact.
Figure 6:
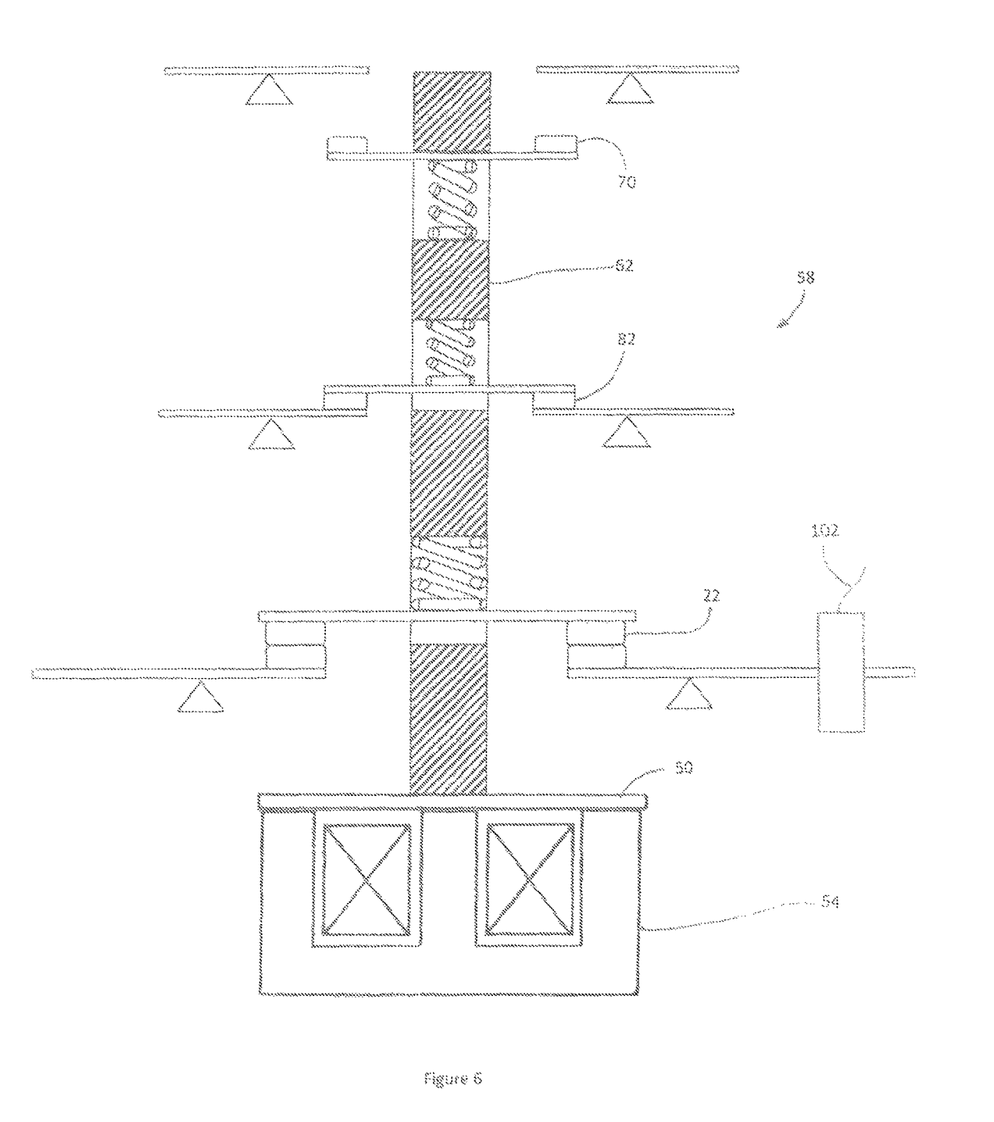
FIG. 6 illustrates the positions of the movable auxiliary contacts at the stable closed (ON) state of the movable power contact.

FIGS. 3 through 6 illustrate one embodiment of the contactor 58 of the present invention moving from the stable OFF (OPEN) state of FIG. 2 to the stable ON (CLOSED) state of FIG. 6. When a closing signal is initiated power is provided to the electromagnet 54 causing the armature 50 and attached contact carrier 62 to move toward the electromagnet 54. As the armature 50 and attached contact carrier 62 move toward the electromagnet 54 the bridge biasing spring 42 moves the bridge 72 of the movable NC auxiliary contact 70 toward its support surface 122. At the point in time when the bridge 72 engages its support surface 122 the movable NC auxiliary contacts 70 begins to separate from their associated fixed NC auxiliary contacts 74, thereby sending the NC auxiliary contact binary signal 90 to processor 98.

Figure 3:
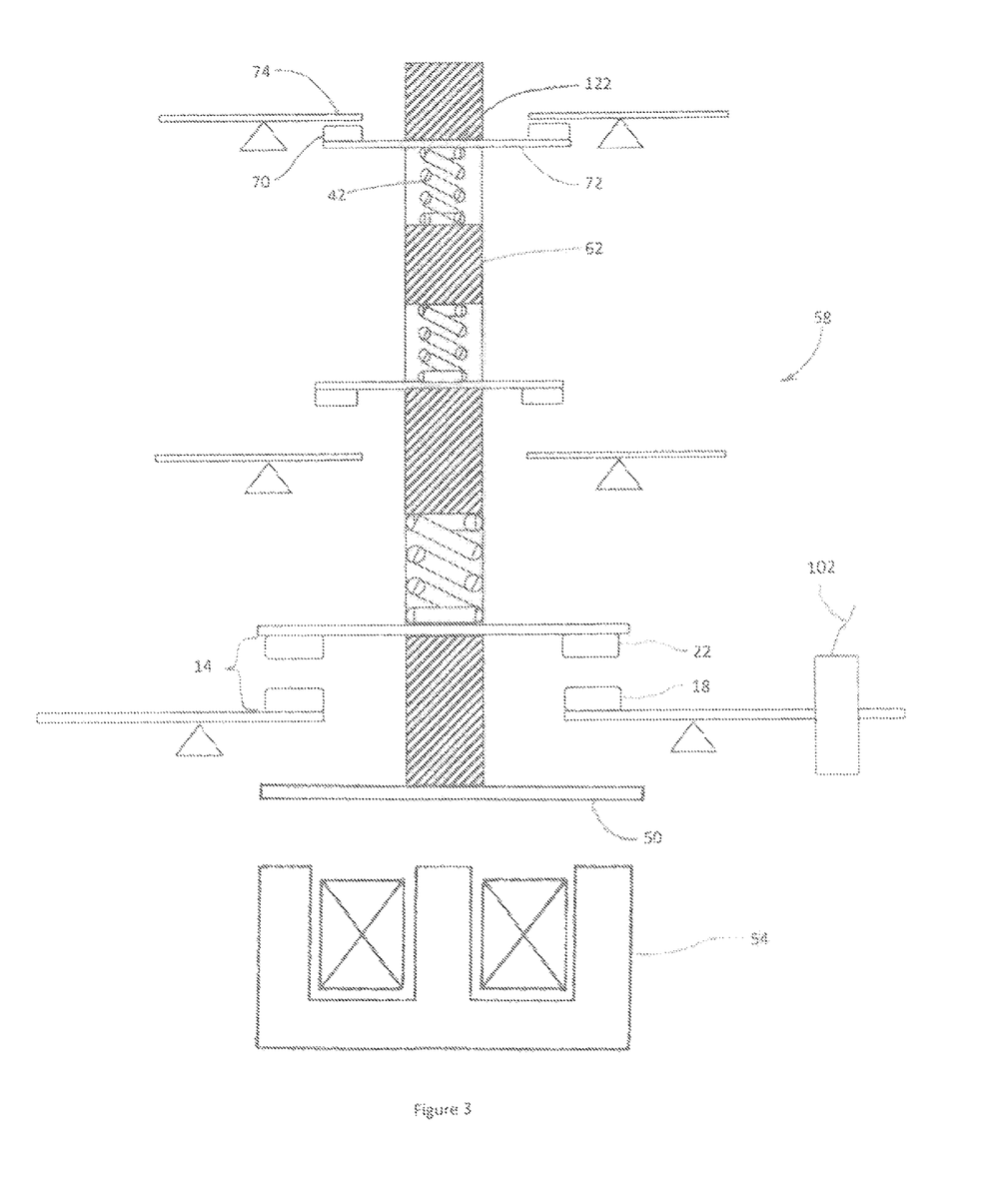
FIG. 3 illustrates the opening position of the NC auxiliary switch as the movable power contact starts moving toward its stable closed (ON) state.

FIG. 3 illustrates the contactor 58 immediately after a signal to close the power contact 14 has been issued, power has been applied to electromagnet 50 and the movable NC auxiliary contacts 70 have separated from the fixed NC auxiliary contacts 74 since the initial separation started when bridge 72 engaged support surface 122. In this embodiment of the invention, the first auxiliary contact signal 90 or 94 received by processor 98 after a change in state of the power contact 14 has been initiated, indicates to the processor 98 whether the contact carrier 62 is closing or opening the power contact 14. Therefore, since a closing operation is being described, processor 98 stores signal 90 in a non-transitory memory 126 associated with the processor 98, as time $T_{0\ close}$, which will be used in determining the current condition of the fixed and movable power contacts, 18 and 22 respectively.

FIG. 4 illustrates the contactor 58 at the point in time when the movable power contacts 22 make initial contact with the fixed power contacts 18. At the point of initial contact, the bridge 26 of movable power contact 22 will start to move away from its support surface 38 by pushing against biasing spring 42 and the power contact signal 102 will be sent to processor 98. The power contact signal 102 is sent from the secondary winding of a current transformer (CT) 134 monitoring an output conductor 138 of the contactor 58. The signal 102 is binary in that it indicates to the processor 98 that current is or is not flowing to a load connected to the contactor 58. The processor 98 stores power contact signal 102 as time $T_{2\ close}$ in memory 126 for use in determining the current condition of the power contacts 18 and 22.

FIG. 5 illustrates the contactor 58 of the present invention at the point in time when the movable NO auxiliary contacts 82 make initial contact with their associated fixed NO auxiliary contacts 86. At the point of initial contact, the bridge 84 of movable auxiliary contact 82 will start to move away from its support surface 130 by pushing against biasing spring 42 and the NO auxiliary contact binary signal 94 will be sent to processor 98. The processor 98 stores the NO auxiliary contact binary signal 94 as time $T_{1\ close}$ in memory 126 for use in determining the current condition of the power contacts 18 and 22.

FIG. 6 illustrates the contactor 58 of the present invention in a final stable ON (CLOSED) state. In this positon the armature 50 is firmly connected to the electromagnet 54, the contact carrier 62 is no longer moving and all movable contacts 22, 70 and 82 are in a stable state.

In moving from the stable ON (CLOSED) state to the stable OFF (OPEN) state the NC and NO auxiliary contacts, 66 and 78 respectively, and the power contact 14 operate in reverse order. When an opening signal is initiated power will be removed from the electromagnet 54 and the armature 50 and attached contact carrier 62 will begin to move away from the electromagnet 54. The NO auxiliary contact 78 will open sending binary signal 94 to the processor 98 indicating to the processor 98 that the power contact 14 is opening. The processor 98 will store the binary signal 94 as time $T_{0\ open}$ in memory 126. Power contact 14 will open sending signal 102 to the processor 98. The processor 98 will store the signal 102 as time $T_{2\ open}$ in memory 126. And finally the NC auxiliary contact 66 will close sending binary signal 90 to processor 98. The processor 98 will store the binary signal 90 as time $T_{1\ open}$ in memory 126. In the embodiment described above, although one of the NC or NO auxiliary contacts, 66 or 78 respectively, operates before the power contact 14 operates and the other operates after the power contact 14 has operated, this operating sequence is not a requirement of the invention to function properly.

In addition to times $T_0$, $T_1$ and $T_2$ there are fixed distances that can be used in determining the current condition of the power contacts 18 and 22. The fixed linear distance $D_1$ between the support surface 122 of the NC movable auxiliary contact 66 and the support surface 130 of NO movable auxiliary contact 82 is fixed during manufacturing of the contact carrier 62, as is the fixed linear distance $D_2$ between the support surface 130 of NO movable auxiliary contact 82 and the support surface 38 of movable power contact 22. These fixed distances do not change regardless of the direction in which the contact carrier 62 is moving or how many times the contactor 58 has operated. Fixed distances $D_1$ and $D_2$ are shown in FIG. 4, along with the initial power contact thickness dimension $D_3$, which is the sum of the thickness of both the movable power contact 22 and fixed power contact 18. A fourth initial distance $D_4$ that can be used in determining the current condition of power contact 14 is the initial gap between the movable power contact 22 and fixed power contact 18 when in the stable OFF (OPEN) position, as shown in FIG. 2. Dimension $D_3$ and distance $D_4$ change in opposite directions as the power contact 18 and 22 wear (erode). Dimension $D_3$ will decrease as contacts 18 and 22 wear and distance $D_4$ will increase as the contacts 18 and 22 wear. Fixed distances $D_1$, and $D_2$ initial dimension $D_3$ and initial distance $D_4$ can be provide by the manufacturer or measured and stored in memory 126 for use in determining the current condition of the power contacts 18 and 22. The accumulated number of operating cycles ACO of the contactor 58 can also be sensed by processor 98 and stored in memory 126 for determining when preventive maintenance is required.

Figure 7:
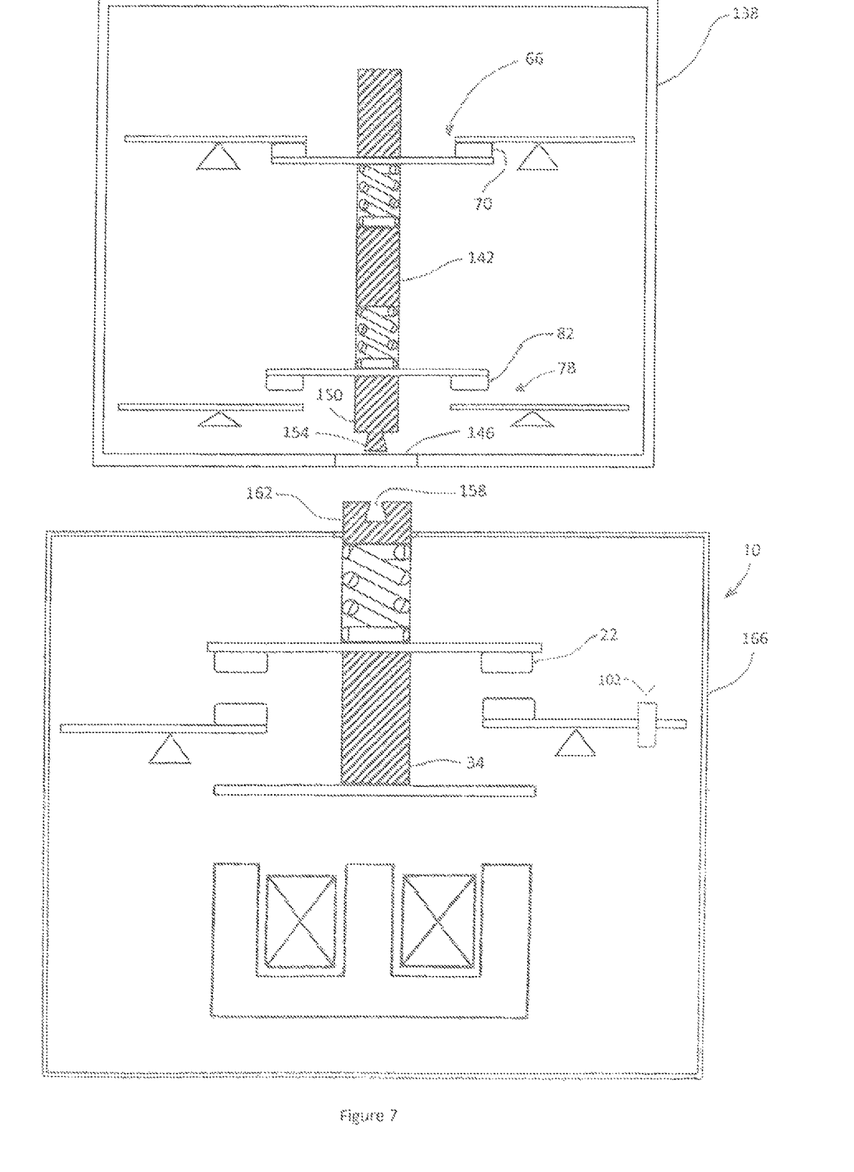
FIG. 7 illustrates an embodiment in which the auxiliary switches are configured as a retrofit mechanically attachable to the power contact operator.

FIG. 7 illustrates an alternate construction of the invention where the NC and NO auxiliary contacts, 66 and 78 respectively, are configured for retrofitting an existing contactor 10. In the retrofit device the NC and NO auxiliary contacts, 66 and 78 respectively, are enclosed in their own housing 138 and the auxiliary contact operator 142, to which they are attached, extends through an opening 146 in the housing 138. In this example the extended end 150 of the contact operator 142 include a dovetail 154 to be slideably received in a dovetail socket 158 in an extending end 162 of the contact carrier 34 of contactor 10. Once the dovetail 154 is received in the dovetail socket 158 the auxiliary contact housing 138 can be attached to the contactor enclosure 166. The connected contact carrier 34 and auxiliary contact operator 142 will permit the movable contacts 22, 70 and 82 to move in unison as described above with respect to the one-piece contact carrier 62. It is to be understood that the embodiment described is not limiting and that other means for connecting the auxiliary contact operator 142 of a retrofit device and a contact carrier 34 of an existing contactor 10 are covered by this disclosure. It is also understood that the auxiliary contact housing 138 can be located at any point on the contactor enclosure 166 that permits the auxiliary contact operator 142 of the retrofit device to be connected to the contact carrier 34 of the contactor 10 for common movement of the contact carrier 34 and auxiliary contact operator 142.

FIG. 8 illustrates elements of the controller 118 used to determine the current condition of the power contacts 18 and 22, and notifying the automated preventive maintenance service 106 and or user 110 that power contact 14 replacement is required. The controller 118 includes the processor 98 and non-transitory memory 126 associated with the processor 98. Information derived from the NC and NO auxiliary contact binary signals, 90 and 94 respectively, power contact signals 102 and learned or determined characteristics of the contact carrier 62 are stored in memory 126. The stored information and algorithms 170 and 174, also stored in memory 126, are used by processor 98 when determining the current condition of the power contacts 18 and 22, and when to notify the preventive maintenance 106 service or a user 110 that contact replacement is required.

Figure 9:
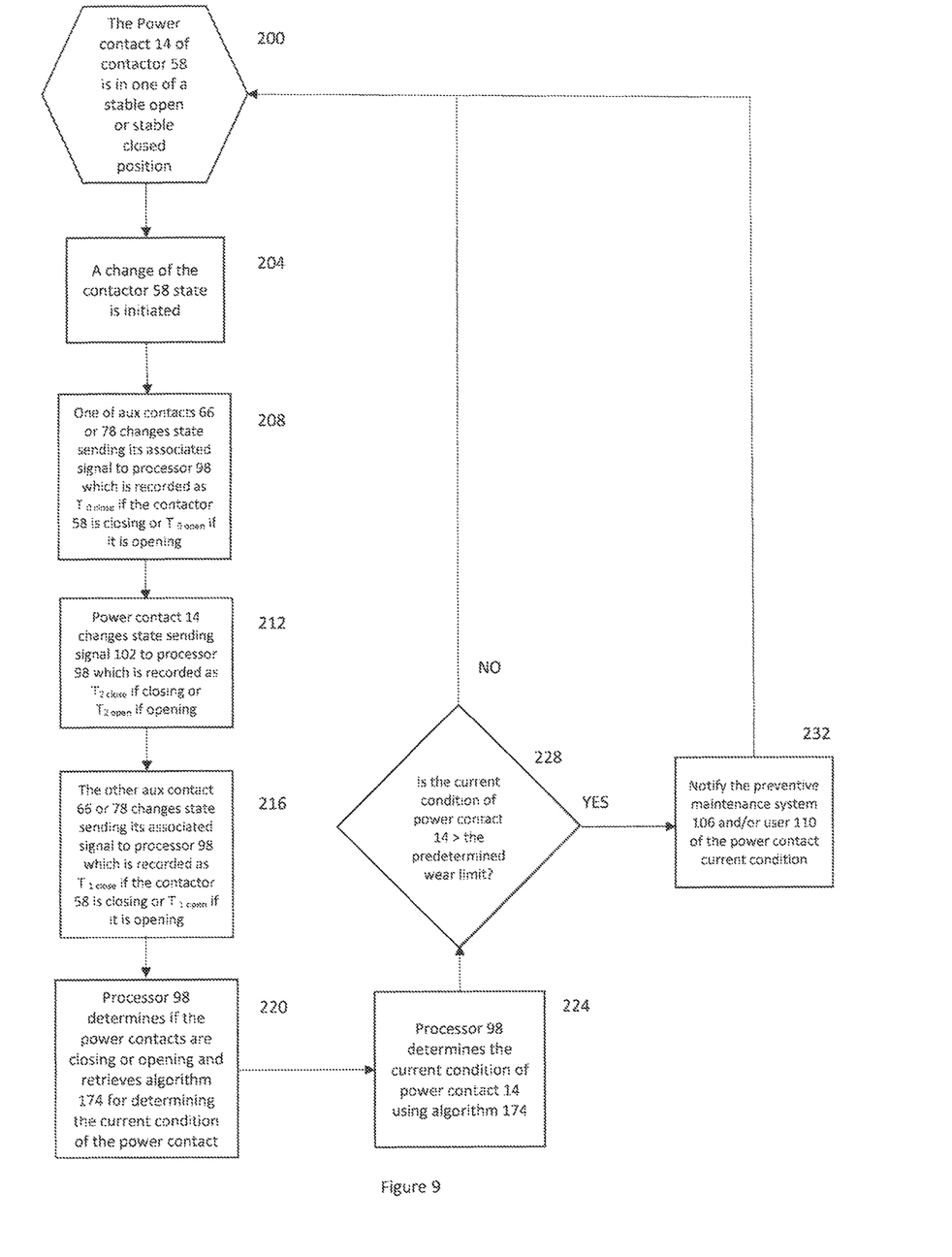
FIG. 9 is a flow chart of the basic current condition and notification algorithms.

FIG. 9 is a flow chart of the basic steps of algorithm 170, which acquires the information required to determine the current condition of power contacts 18 and 22, and if a preventive maintenance action is required. At step 200 the movable power contacts 22, movable NC auxiliary contacts 70 and movable NO auxiliary contacts 82 of contactor 58 are all in one of a stable OPEN or stable CLOSED positon. At step 204 a signal to change the state of the contactor 58 is initiated and power is either applied to or removed from the electromagnet 54, which causes the contact carrier 62 to begin moving either toward or away from the electromagnet 54. At step 208 the NC auxiliary contact 66 will open sending signal 90 to the processor 98 if the contact carrier 62 is moving toward the electromagnet 54 or the NO auxiliary contact 78 will open sending signal 94 to the processor 98 if the contact carrier 62 is moving away from the electromagnet 54. The first signal 90 or 94, received by the processor 98 represents initiation of a change of contactor 58 state and the direction of the contact carrier 62 movement with respect to the electromagnet 54. These first signals are represented by and stored as time $T_{0\ open}$ if the contactor 58 is opening and $T_{0\ close}$ if the contactor 58 is closing. At step 212 the power contact 14 will close sending signal 102 to the processor 98 if the contact carrier 62 is moving toward the electromagnet 54 or open sending signal 102 to the processor 98 if the contact carrier 62 is moving away from the electromagnet 54. Signal 102 is represented by and stored as time $T_{3\ open}$ if the contactor 58 is opening or $T_{3\ close}$ if contactor 58 is closing. At step 216 the NO auxiliary contact 78 will close sending signal 94 to the processor 98 if the contact carrier 62 is moving toward the electromagnet 54 or the NO auxiliary contact 78 will open sending signal 94 to the processor 98 if the contact carrier 62 is moving away from the electromagnet 54. The last signal 90 or 94, received by processor 98 represents termination of the contactor 58 state change and are represented by time $T_{2\ open}$ if the contactor 58 is OPEN or $T_{2\ close}$ if contactor 58 is CLOSED. At step 220 the processor 98 retrieves algorithm 174 from memory 126 for determining the current condition of the power contacts 18 and 22. At step 224 the processor 98 determines the current condition of the power contacts 18 and 22 by using algorithm 174, which is described in more detail below. At step 228 the processor 98 compares the current condition of the power contacts 18 and 22 determined in step 224 with a predetermined wear limit stored in memory 126. The wear limit can be any one or more of a predetermined percent of the initial contact material, a predetermined amount of the initial contact material thickness, a predetermined amount of the determined remaining contact life or an estimated number of remaining contactor 58 operations. If the current condition of the power contacts 18 and 22 determined in step 224 is less than the stored predetermined wear limit the processor 98 will return to step 200 for continued monitoring of the current condition of the power contacts 18 and 22. If the current condition of the power contacts 18 and 22 determined in step 224 is more than the stored predetermined wear limit the processor 98 will move to step 232, where a notification will be sent to the automated preventive maintenance system 106 and/or a user 110 indicating that the current condition of the power contacts 18 and 22 has exceeded the predetermined limit and power contacts 18 and 22 should be replaced. After the notifications have been sent in step 232 the processor 98 will return to step 200 for continued monitoring of the current condition of the power contacts 18 and 22.

Figure 10:
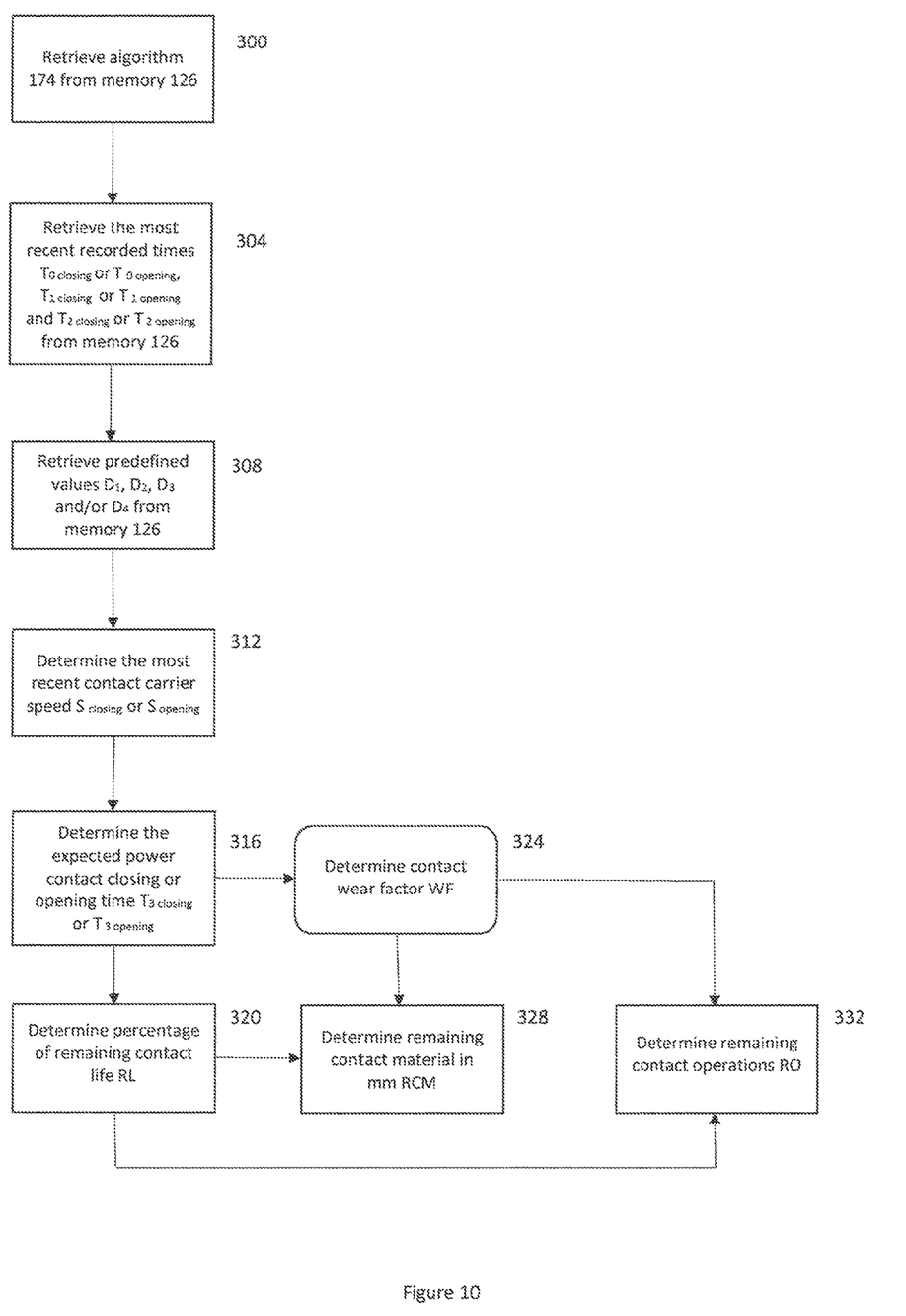
FIG. 10 is a flow chart of the power contact current condition determining algorithm.

Referring now to FIG. 10, at step 300, the processor 98 will retrieve algorithm 174 from memory 126. At step 304 the processor 98 will retrieve times $T_0$, $T_1$ and $T_2$ stored in memory 126 during the immediately preceding contactor 58 closing or opening event. At step 308 the processor 98 will retrieve the previously stored fixed distances $D_1$, and $D_2$, and initial dimension $D_3$, and distance $D_4$, the number of accumulated contactor operations ACO and the estimated contactor lifetime operations ECLO from memory 126. At step 312 the processor 98 will determine the contact carrier 62 speed S during the immediately preceding contactor 58 closing or opening event using the retrieved immediately preceding time $T_0$, time $T_1$ and fixed distance $D_1$. The determined contact carrier 62 speed can be stored in memory 126 as $S_{closing}$ or $S_{opening}$ depending on which direction the contact carrier 62 is moving.

$$S=D_1/(T_1-T_0)$$

At step 316 the processor 98 will determine the expected power contact 14 closing or opening time $T_3$ using the contact carrier 62 speed S during the immediately preceding contactor 58 closing or opening event and fixed distance $D_2$. The determined expected power contact 14 closing or opening time can be stored in memory 126 as $T_{3\ closing}$ or $T_{3\ opening}$ depending on which direction the contact carrier 62 is moving.

$$T_3=D_2/S$$

At step 320 the processor 98 determines the percent of remaining contact life RL% using the expected power contact 14 closing or opening time $T_3$, the actual power contact 14 closing or opening time $T_2$ and initial dimension $D_3$. The determined percent of remaining contact life RL% can be stored in memory 126 as RL %$_{closing}$ or RL %$_{opening}$ depending on which direction the contact carrier 62 is moving.

$$RL\ \%=1-((T_2-T_3)*D_3)/100$$

At step 324 a wear factor WF can also be determined by processor 98 using the expected power contact 14 closing or opening time $T_3$, the actual power contact 14 closing or opening time $T_2$ and contact carrier 62 speed S during the immediately preceding contactor 58 closing or opening event. The determined wear factor WF can be stored in memory 126 as $WF_{closing}$ or $WF_{opening}$ depending on which direction the contact carrier 62 is moving.

$$WF=((T_2-T_3)*S)/100$$

At step 328 the processor 98 can determine the amount of remaining power contact material RCM in the fixed and movable power contacts, 18 and 22 respectively, using the measured or provided initial contact thickness dimension $D_3$ or the initial measured or provided distance (gap) $D_4$ between the fixed and movable power contacts, 18 and 22 respectively, and the percent of remaining life RL% or the wear factor WF.

$$RCM=D_3*RL\ \%\ \text{or}\ RCM=D_4-(D_4*WF)$$

$$RCM=D4-(D4*RL\ \%)$$

At step 332 the processor 98 can also determine a remaining number of contactor 58 operations RO using the stored number of expected contactor lifetime operations ECLO and one of the percent of remaining life RL%, the wear factor WF or the accumulated operations count AOC.

$$RO=ECLO*RL\ \%,\ RO=ECLO*WF\ \text{or}\ RO=ECLO-ACO$$

It is to be understood that algorithm 174 can be incorporated into algorithm 170.

Examples of the methods and systems discussed herein are not limited in application to the details of construction and the arrangement of components set forth in the description or illustrated in the accompanying drawings. The methods and systems are capable of implementation in other embodiments and of being practiced or of being carried out in various ways. Examples of specific implementations are provided herein for illustrative purposes only and are not intended to be limiting. In particular, acts, components, elements and features discussed in connection with any one or more examples are not intended to be excluded from a similar role in any other examples.

Also, the phraseology and terminology used herein is for the purpose of description and should not be regarded as limiting. Any references to examples, embodiments, components, elements or acts of the systems and methods herein referred to in the singular may also embrace embodiments including a plurality, and any references in plural to any embodiment, component, element or act herein may also embrace embodiments including only a singularity. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A system for determining a current condition of a power contact in an electrical contactor comprising:
   a power contact having a movable contact supported on a bridge and a fixed contact;
   a first auxiliary contact having a movable contact supported on a bridge and a fixed contact;
   a second auxiliary contact having a movable contact supported on a bridge and a fixed contact;
   a contact carrier supporting the movable power contact bridge, the first auxiliary movable contact bridge and the second auxiliary movable contact bridge such that the movable contacts move in unison and such that the movable contacts of the first and second auxiliary contacts are spaced apart by a first fixed distance and the movable contact of the second auxiliary contact and the movable power contact are spaced apart by a second fixed distance;
   a controller having a processor and a non-tangible memory, the first fixed distance, the second fixed distance, contactor characteristics and an algorithm for determining the current condition of the power contact being previously stored in the non-tangible memory, the processor receiving a binary signal from each of the power contact, the first auxiliary contact and the second auxiliary contact indicating the opening or closing of their respective movable contacts and storing each binary signal received from the power contact, the first auxiliary contact and the second auxiliary contact in the non-tangible memory; and,
   wherein the algorithm, being executed by the processor, determines the current condition of the power contact based on the stored binary signals, the fixed distances and the previously stored contactor characteristics, the processor notifying a preventive maintenance system and/or a user that preventive maintenance on the contactor is required when the determined current condition of the power contact has exceeded a predetermined wear limit.

2. The system of claim 1, wherein the determined current condition of the power contacts can include one or more of a percent of remaining contact life, an amount of remaining power contact material or a number of remaining contactor operations.

3. The system of claim 1, wherein the current condition of the power contact is determined by:
determining a speed of the contact carrier;
determining an expected closing/opening time of the power contact;
sensing an actual closing/opening time of the power contact, and;
determining, from the determined contact carrier speed, the determined expected power contact closing/opening time, the sensed actual power contact closing/opening time and the previously stored contactor characteristics, one or more of a percent of remaining power contact life, a contact wear factor, an amount of remaining power contact material or a number of remaining contactor operations.

4. The system of claim 3, wherein the speed of the contact carrier is determined from the binary signals of the first auxiliary contact and the second auxiliary contact and the first fixed distance.

5. The system and method of claim 3, wherein the expected power contact closing/opening time is determined from the determined contact carrier speed and the second fixed distance.

6. The system of claim 1, wherein the first auxiliary contact can be one of a normally open contact or a normally closed contact and the second auxiliary contact can be the other of a normally open or a normally closed contact.

7. The system of claim 1, wherein the previously stored contactor characteristics can include determined/learned characteristics such as an initial or immediately preceding contact carrier speed, an initial or immediately preceding time between the first auxiliary contact opening or closing and the second auxiliary contact opening or closing, an initial or immediately preceding time between the second auxiliary contact opening or closing and the power contact opening or closing, an initial or immediately preceding expected power contact closing/opening time or a number of lifetime contactor operations.

8. The system of claim 7, wherein the initial contact carrier speed, the initial time between the first auxiliary contact opening or closing and the second auxiliary contact opening or closing, the initial time between the second auxiliary contact opening or closing and the initial power contact opening or closing time and the number of life time contactor operations can be determined/learned during a predetermined number of initial operations of the contactor or provided by the contactor manufacturer based on product development testing or a Design of Experiments (DOE) process.

9. The system and method of claim 1, wherein the previously stored contactor characteristics can include measured or provided characteristics such as the first fixed distance, the second fixed distance, an initial dimension between the movable power contact and the fixed power contact when the power contacts are in a stable open state or an initial thickness of the combined movable and fixed power contacts.

10. The system of claim 1, wherein the predetermined wear limit can be established by the user.

11. The system of claim 1, wherein the predetermined wear limit is selected such that notifying the preventive maintenance system and/or user is sufficiently ahead of a potential power contact failure that an acceptable maintenance down time of the contactor and affected equipment can be scheduled.

12. The system of claim 1, wherein the controller can be a part of the contactor or located at a remote location.

13. The system of claim 12, wherein the controller can be a programmable logic controller (PLC) or any "smart" device capable of executing the algorithm.

14. The system of claim 1, wherein an auxiliary contact operator supporting the movable contacts of the first and second auxiliary contacts is enclosed in a housing provided with means for attaching to an existing contactor, the auxiliary contact operator having an extended end with provisions for attaching to the contact carrier of the existing contactor such that the movable contacts of the first and second auxiliary contacts move in unison with the movable contact of the existing contactor.

15. A method for determining a current condition of a power contact in an electrical contactor comprising:
retrieving, by a processor, from a non-tangible memory associated with the processor, one or more characteristics of the contactor and an algorithm for determining the current condition of the power contact;
determining, by the processor, a closing/opening speed of a contact carrier of the electrical contactor;
determining, by the processor, an expected closing/opening time for a movable power contact supported on the contact carrier;
sensing, by the processor, an actual closing/opening time of the movable power contact;
determining, by the processor, the current condition of the power contact using the determined contact carrier speed, the determined expected closing/opening time of the movable power contact, the sensed actual closing/opening time of the movable power contact and the one or more characteristics of the contactor; and
notifying, by the processor, a preventive maintenance system and/or a user that preventive maintenance is required when the determined current condition of the power contact has exceeded a predetermined wear limit.

16. The method of claim 15, wherein the closing/opening speed of the contact carrier is determined from a known fixed distance between a first movable auxiliary contact supported on the contact carrier and a second movable auxiliary contact supported on the contact carrier, an opening/closing time of the first auxiliary contact and a closing/opening time of the second auxiliary contact.

17. The method of claim 15, wherein the expected closing time of the movable power contact is determined from the determined closing/opening speed of the contact carrier and a known fixed distance between the movable power contact supported on the contact carrier and a movable auxiliary contact supported on the contact carrier.

18. The method of claim 15, wherein the one or more characteristics of the contactor stored in the non-tangible memory can include a combined initial thickness of the movable power contact and an associated fixed power contact, an initial gap dimension between the movable power contact and the fixed power contact when the power contact is in a stable open position, an expected number of lifetime contactor operations, an initial or immediately preceding contact carrier speed, an initial or immediately preceding time between the first auxiliary contact opening or closing and the second auxiliary contact opening or closing, an initial or immediately preceding time between the second auxiliary contact opening or closing and the power contact opening or closing, an initial or immediately preceding expected power contact closing/opening time.

19. The method of claim 15, wherein the predetermined wear limit is selected such that notifying the preventive maintenance system and/or user is sufficiently ahead of a potential power contact failure that an acceptable maintenance down time of the contactor and affected equipment can be scheduled.

\* \* \* \* \*